United States Patent
Nosho et al.

(10) Patent No.: US 8,847,202 B1
(45) Date of Patent: Sep. 30, 2014

(54) DUAL-BAND TYPE-II SUPERLATTICE DETECTORS BASED ON P-B-P DESIGN

(75) Inventors: Brett Z. Nosho, Santa Monica, CA (US); Rajesh D. Rajavel, Oak Park, CA (US); Hasan Sharifi, Agoura Hills, CA (US); Sevag Terterian, Van Nuys, CA (US)

(73) Assignee: HRL Laboratories, LLC, Malibu, CA (US)

( * ) Notice: Subject to any disclaimer, the term of this patent is extended or adjusted under 35 U.S.C. 154(b) by 247 days.

(21) Appl. No.: 13/351,997

(22) Filed: Jan. 17, 2012

Related U.S. Application Data

(60) Provisional application No. 61/433,600, filed on Jan. 18, 2011.

(51) Int. Cl.
| | |
|---|---|
| *H01L 31/00* | (2006.01) |
| *H01L 31/02* | (2006.01) |
| *H01L 31/109* | (2006.01) |
| *H01L 31/11* | (2006.01) |
| *H01L 31/065* | (2012.01) |

(52) U.S. Cl.
CPC ........ *H01L 31/02016* (2013.01); *H01L 31/109* (2013.01); *H01L 31/11* (2013.01); *H01L 31/065* (2013.01)

USPC .............. 257/15; 257/18; 257/214; 257/749; 257/E31.001; 257/E31.107; 257/E31.054; 257/E31.093

(58) Field of Classification Search
None
See application file for complete search history.

(56) References Cited

U.S. PATENT DOCUMENTS

2009/0224228 A1 * 9/2009 Razeghi ........................ 257/21

* cited by examiner

*Primary Examiner* — Yasser A Abdelaziez
(74) *Attorney, Agent, or Firm* — Daniel R. Allemeier; George R. Rapacki

(57) ABSTRACT

A dual-band infrared detector structure based on Type-II superlattices (T2SL) has been developed and experimentally validated. The structure according to the principles of the present invention is designed for a single Indium bump architecture and utilizes a T2SL barrier design that omits the traditional p-n junction region. The barrier design comprises multiple periods where each period comprises multiple monolayers doped P type. By selecting the composition, number of monolayers per period and number of periods, a transition region is created in the conduction band between a first absorber layer and a second absorber layer that allows operation at low biases (<100 mV for both bands) and exhibits a dark current density in the longer wavelength band comparable to that obtained with single-color detectors.

15 Claims, 4 Drawing Sheets

200

DUAL-BAND TYPE-II SUPERLATTICE DETECTORS BASED ON P-B-P DESIGN

This application claims priority to provisional application 61/433,600 filed Jan. 18, 2011 titled Dual-Band Type-II Superlattice Detectors Based on p-B-p Design. Provisional application 61/433,600 is incorporated by reference herein.

STATEMENT REGARDING FEDERALLY SPONSORED RESEARCH OR DEVELOPMENT

This invention was made with Government support under Contract No. FastFPA S09-102166 awarded by the US Government. The Government has certain rights in the invention.

FIELD OF THE INVENTION

The present technology relates to an apparatus and method for improving the sensitivity of a dual band photodetector while also reducing the dark current.

BACKGROUND OF THE INVENTION

InAsSb bulk materials do not translate well to high performance Long Wave Infra Red photodetectors due to the lattice mismatch. Some work has been done on using nBn designs with Type II Superlattice (T2SL) absorber layers to avoid the lattice mismatch problem. However, due to the poor diffusion of holes in T2SLs, absorber layers need to be doped p-type so that the higher mobility electrons are the minority carriers. T2SLs doped n-type will inevitably have limited quantum efficiency. [e.g., see Lee et al., "Subband transitions in dual-band n-B-n InAs/GaSb superlattice infrared photodetector identified by photoresponse spectra" in Appl. Phys. Lett 95, 102106 (2009).]

Dual band photodetectors have been based on pNp or n-p-B-p-n T2SL architectures. Dual-band functionality has been demonstrated for LWIR and VLWIR detectors using this architecture. For example, NWU has published data using this type of design [Appl. Phys. Lett 92, 111112 (2008)].

SUMMARY OF THE INVENTION

The principles of the present invention are embodied in a P type doped barrier dual band photodetector and in particular a Type II Superlattice Dual Band Photodetector.

One embodiment of the principles of the present invention comprises a dual band photodetector comprising: a T2SL barrier layer with an upper surface and a lower surface, the T2SL barrier layer comprising a plurality of monolayers doped P type with a dopant; a first absorber layer disposed on the upper surface of the T2SL barrier layer; a second absorber layer disposed on the lower surface of the T2SL barrier layer. In another embodiment of the principles of the present invention, the previously described dual band photodetector wherein the plurality of monolayers comprise repeating sets of layers of a first type, a second type and third type. Alternatively, the dual band photodetector of previously described wherein the P type doping is between 1.0E15 and 1.0E16 per $cm^3$.

In another embodiment of the principles of the present invention, wherein the first type of monolayer comprises AlSb, the second type of monolayer comprises InSb and the third type of monolayer comprises InAs. The previously described dual band photodetector wherein a number of monolayers of a first type is 4, a number of monolayers of a second type is 0.75 and a number of layers of a third type is 15.

In an alternative embodiment of the previously described dual band photodetector wherein a number of sets of repeating layers comprise an overall thickness of 2500 angstroms.

In another embodiment of the principles of the present invention the dual band photodetector wherein the plurality of monolayers comprise repeating sets of layers of a first type, a second type third type and a fourth type. The first type of monolayer comprises InSb, the second type of monolayer comprises AlSb, the third type of monolayer comprises InSb and the fourth type of monolayer comprises InAs. The number of monolayers of a first type is 0.325, a number of monolayers of a second type is 4, a number of layers of a third type is 0.325 and a number of monolayers of a fourth type is 15. The number of sets of repeating layers comprise an overall thickness of 2500 angstroms.

In another embodiment of the principles of the present invention the dual band photodetector comprises a T2SL barrier layer with an upper surface and a lower surface, the T2SL barrier layer comprising a plurality of monolayers doped P type with a dopant; a first absorber layer disposed on the upper surface of the T2SL barrier layer; a second absorber layer disposed on the lower surface of the T2SL barrier layer, wherein the plurality of monolayers comprise repeating sets of layers of a first type and a second type. wherein the P type doping may be between 1.0E15 and 1.0E16 per $cm^3$. The first type of monolayer may comprise AlSb and the second type of monolayer may comprises InAs.

In another embodiment of the principles of the present invention comprises a Type II Superlattice Dual Band Photodetector comprising: a first absorber layer adapted to absorb light with a wavelength between 3 microns and 14 microns; a second absorber layer adapted to absorb light with a wavelength between 3 microns and 14 microns; and a barrier layer means disposed between the first absorber layer and the second absorber layer for eliminating a depletion region between the first absorber layer and the second absorber layer for the dual band Photodetector.

In another embodiment of the principles of the present invention comprises a method of making a Type II Superlattice Dual Band Photodetector comprising the steps of: receiving a substrate and disposing an etch stop layer on the substrate; disposing a first contact layer on the etch stop layer; disposing a first absorber layer on the first contact layer; disposing a Type II Super Lattice barrier layer on the first absorber layer; disposing a second absorber layer on the barrier layer; disposing a second contact layer on the second absorber layer. The method may further comprise doping the barrier layer P-type. The dopant may be beryllium.

BRIEF DESCRIPTION OF THE DRAWINGS

The accompanying drawings, together with the specification, illustrate exemplary embodiments of the present invention, and, together with the description, serve to explain the principles of the present invention. The accompanying drawings use the same reference numbers for the same components.

DETAILED DESCRIPTION

Figure 1:
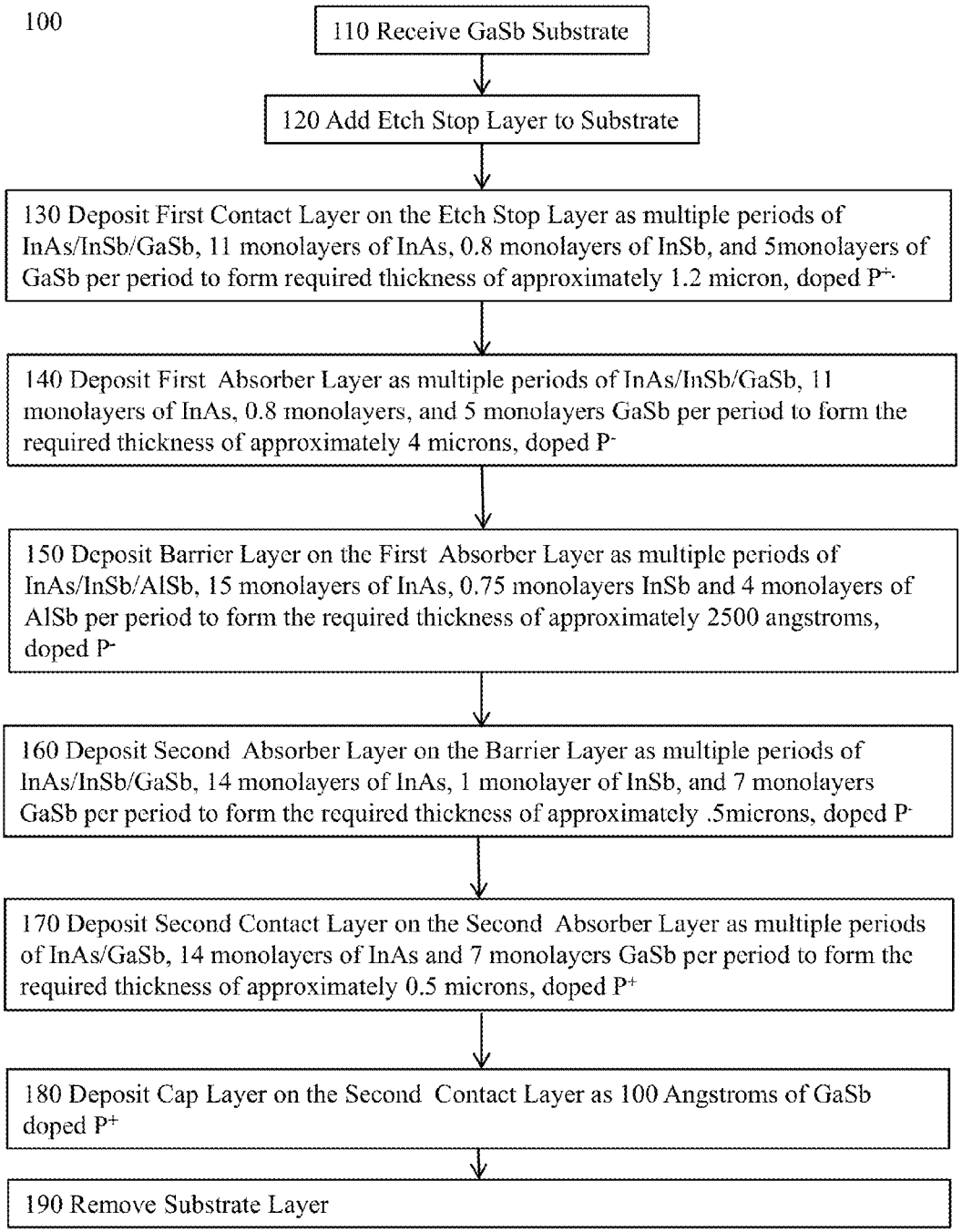
FIG. 1 shows a method of forming a structure according to the principles of the present invention.

In the following detailed description, only certain exemplary embodiments of the present invention are shown and described, by way of illustration. As those skilled in the art would recognize, the described exemplary embodiments may be modified in various ways, all without departing from the spirit or scope of the principles of the present invention. Accordingly, the drawings and description are to be regarded as illustrative in nature, and not restrictive.

The problems described in the background section are at least partially solved by the principles of the present invention, including, by P type doping of a multiple layer barrier structure. The structure of an embodiment of the principles of the present invention uses a barrier structure comprising multiple layers, chosen to lattice match to the absorber layer above and below, and to present a transition in the conduction band from a first absorber layer to a second absorber layer across the barrier layer such that the majority carrier block is maintained while the minority carrier discontinuity is minimized. The principles of the present invention result in a Type II Superlattice Dual Band Photodetector with suppressed dark current and minority carrier recombination.

A superlattice is made of two semiconductor materials of different band gaps. A Type II Superlattice has conduction and valence bands staggered in real and reciprocal space so that electrons and holes are confined in different layers. A photodetector comprising two Type II Superlattice structures for detecting two wavelengths of light will generally have offsets between the conduction bands of the absorber layers. Dual band detectors require a barrier layer to separate the two absorber layers.

A dual-band infrared detector structure based on Type-II superlattices (T2SL) has been developed and experimentally validated. The structure according to the principles of the present invention is designed for a single Indium bump architecture and utilizes a barrier design that omits the traditional p-n junction region. Without implying a limitation, the structure has been demonstrated to operate at low biases (typically less than 300 mV for both bands) and exhibits a dark current density in the longer wavelength band comparable to that obtained with single-color detectors. The single Indium bump architecture requires the bias on the detector be alternated between that for a first absorber layer and a second absorber layer.

The dual-band detector according to the principles of the present invention removes the traditional p-n junctions used in T2SL-based infrared detectors. Unlike the more conventional p-N-p detector design, the p-$B_p$-p structures according to the principles of the present invention minimize depletion in the absorber layers by doping the T2SL barrier p-type (the same as the absorber layers). Presently, generation-recombination current dominates the dark current of T2SL detectors and limits the detector performance. Since generation-recombination current originates in the depletion region of p-n junctions, the principles of the present invention allows for a minimal electric field in the absorber layers and hence reduced generation-recombination current.

The principles of the present invention benefit the development of dual-band focal plane arrays based on T2SL technology. Since T2SL Long Wave InfraRed (LWIR) absorbers are often limited by the generation-recombination current, the principles of the present invention will be particularly relevant to LWIR1/LWIR2 or Mid Wave InfraRed (MWIR)/LWIR dual-band detectors. Long Wave Infrared wavelength is generally considered 7-14 microns while Mid Wave Infrared wavelength is 3-5 microns.

One of the main advantages of prior art p-n junctions in detectors is that they do create an electric field. If designed properly, p-n junction based detectors should be able to operate with relatively low applied bias while the electric field help separate and collect the photo-generated carriers. For a dual-band design with p-n junctions, the ideal structure would likely require a complex design (e.g. graded gap design) with an asymmetric barrier design separating the two absorber regions.

Figure 3A:
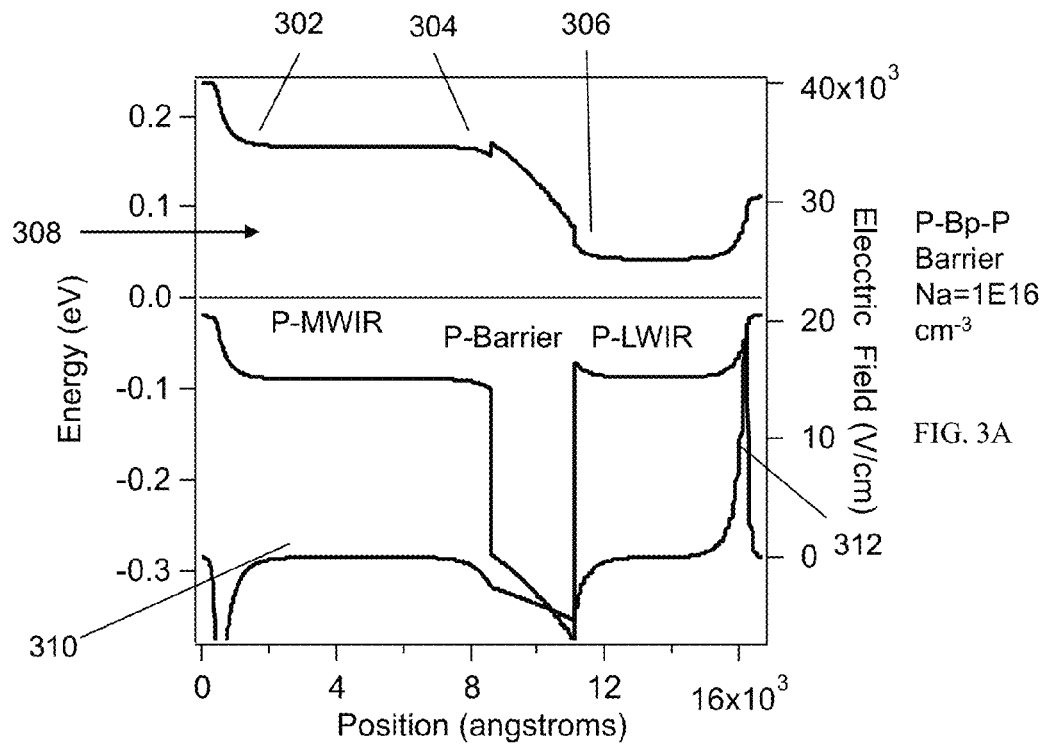
FIG. 3A presents the band diagram for a photodetector according to the principles of the present invention.
Figure 3B:
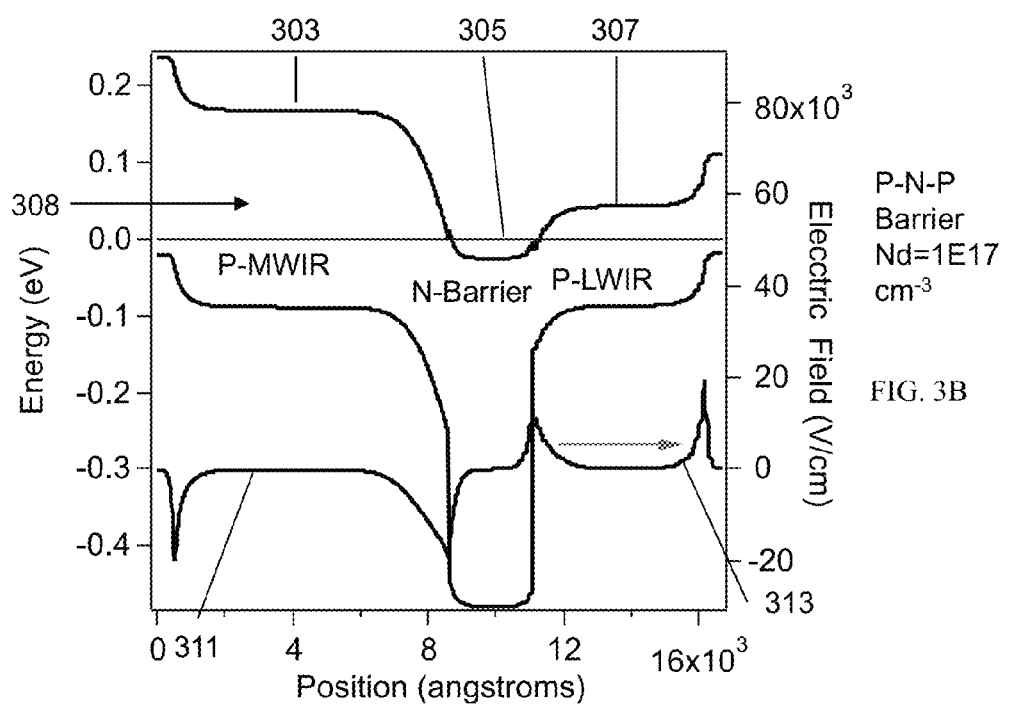
FIG. 3B presents the band diagram for a prior art photodetector.

FIG. 3A illustrates the modeled Poisson band diagram bending for low-field p-$B_p$-p dual-band design according to the principles of the present invention and a prior art p-N-p design illustrated in FIG. 3B. The p-$B_p$-p design band diagram of FIG. 3A eliminates depletion (mild accumulation shown) in the Long Wave InfraRed absorber for reduced dark generation-recombination current. The significant band bending and accompanying depletion in FIG. 3B results in increased generation-recombination current. Due to significant band bending at the junction for the prior art p-N-p design, the mid-gap defect states contribute generation-recombination with an activation energy approximately equal to Eg/2. Due to the near-flat band conditions achieved in the p-$B_p$-p design, the mid-gap defects states are filled and therefore not available to participate in the generation-recombination process. In addition, the near-flat bands 304-306 for the Mid Wave InfraRed and Long Wave InfraRed absorber achieved with p-$B_p$-p design (FIG. 3A) results in 2-5× reduction in dark current as compared to the prior art p-N-p design 305-307 (FIG. 3B).

For the prior art p-N-p detector shown in FIG. 3B, the electric field 313 in the p-LWIR absorber layer at the junction is high ($1 \times 10^4$ V/cm) as indicated by significant band bending/depletion, which results in increased generation-recombination current. On the other hand there is mild accumulation (no depletion) for the p-$B_p$-p detector according to the principles of the present invention shown in FIG. 3A that results in reduced generation-recombination current.

Besides achieving flat band (low field) operation, the turn-on bias for detectors built according to the principles of the present invention are low (typically <300 mV), such that the field due to the applied bias does not penetrate into the absorber to cause band bending, which results in increased generation-recombination current. The dual band detector of FIG. 3A is a p-$B_p$-p design with low electric field ($<1 \times 10^3$ V/cm, vs. $1 \times 10^4$ V/cm for conventional p-N-p detectors) in the LWIR absorber enables low bias operation to minimize generation-recombination dark current. Typical bias values are +/−50 mV for MWIR, and +/−150 mV for LWIR. In addition, the p-$B_p$-p structure is a simple design that includes only a single superlattice barrier design.

There is a practical range of doping for which the p-B-p design according to the principles of the present invention will be effective. That doping range offers additional margin for producing high-quality material on a consistent basis. Typically the doping range of the barrier region is the critical element of the design and needs to be less than or equal to 1E16 per cm$^3$, with lower doping being preferred. In one embodiment, the doping may be actually slightly n-type so that the effective value of the final doping level to be less than or equal to 1.0E16, with slightly P-type being better.

A photodetector with a P-type doped Type II Superlattice barrier layer as described below is a means for providing a transition from the conduction band of a first absorber region to the conduction band of a second absorber region. The P-type doped Type II Superlattice barrier layer described below is a means for maintaining a positive conduction band across the transition from a first absorber layer to a second absorber layer. The P-type doped Type II Superlattice barrier layer described below is a means for eliminating the depletion region between two absober regions for a dual band photodector.

By way of example and not limitation, the following embodiments are particularly suited for detecting light in the 0.5 micron to 20 micron wavelengths. According to the principles of the present invention different material combinations will allow other wavelengths of light to be detected.

Functionally, the Type II Superlattice barrier layer according to the principles of the present invention should block holes from travelling between absorber layers and provide for as smooth transition in the conduction band from a first absorber layer to a second absorber layer consistent with detector physics. An ideal transition would be a straight line from the conduction band of a first absorber layer to the conduction band of a second absorber layer. In addition, the thickness of the T2SL barrier layer should be sufficient to prevent or minimize majority carrier tunneling through the T2SL barrier layer. A preferred thickness of the T2SL barrier layer is less than 0.5 microns. The cutoff wavelengths of the first and second absorber layers sets the necessary bandgap in the absorber layers and the value of the conduction band energy level. Given these values of the conduction band, a T2SL barrier layer is designed to provide a smooth transition between the two absorber layers by varying the doping level, composition and structure of the T2SL barrier layer. Various structures and compositions of the T2SL barrier layer are possible. Preferred embodiments are described below but are meant as exemplary only and no limitation is implied. Persons skilled in the art will appreciate various T2SL designs are within the scope of the principles of the present invention.

Figure 2A:
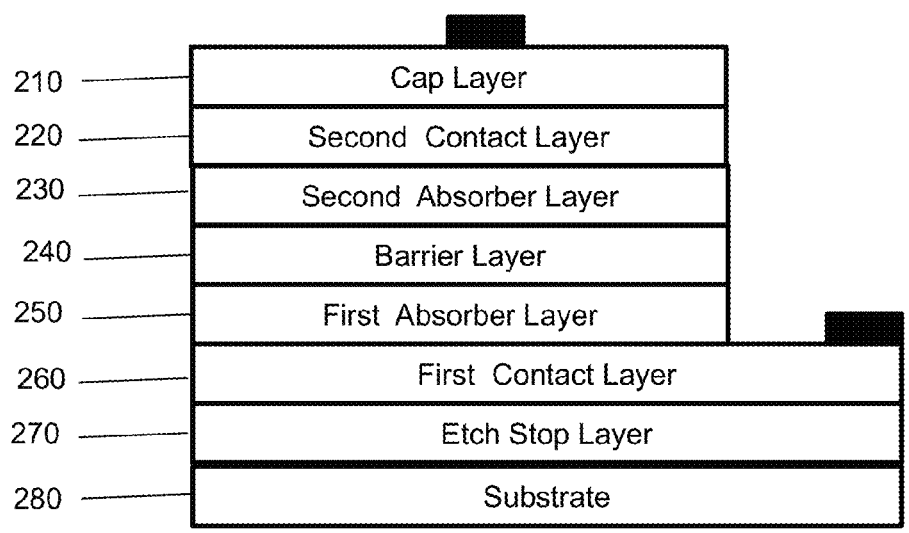
FIG. 2A shows a structure of a photodetector element of a focal plane array according to the principles of the present invention.

The nominal structure according to the principles of the present invention is shown in FIG. 2A. In FIG. 2A the detector 200 comprises a first contact layer 270 on a substrate 280. An etch stop layer 270 may be disposed between the first contact layer 270 and the substrate 280 to facilitate the removal of the substrate layer 280. The barrier layer 240 is disposed on the first absorber layer, the second absorber layer 230 is disposed on the barrier layer, a second contact layer 220 is disposed on the second absorber layer 230. A cap layer 210 may be disposed on the second contact layer 220.

For a LWIR/LWIR embodiment the first contact layer 260 comprises multiple periods of InAs/InSb/GaSb where each period comprises 11 monolayers of InAs, 0.8 monolayers of InSb, and 5 monolayers of GaSb. Without implying a limitation, approximately 200 periods of InAs/InSb/GaSb are built up to form a contact layer approximately 1.2 micron thick. The first contact layer 260 may be doped $P^+$ type with compounds and to a density known to those of skill in the art.

For a first Long Wave absorber region, the first absorber layer 250 comprises multiple periods of InAs/InSb/GaSb where each period comprises 11 monolayers of InAs, 0.8 monolayers of InSb and 5 monolayers of GaSb. Without implying a limitation, sufficient periods of InAs/InSb/GaSb are built up to form the first absorber layer 250 approximately 4 microns thick. The first absorber layer 250 may be doped Fr type with compounds and to a density known to those of skill in the art.

Continuing with FIG. 2A, the barrier layer 240 is disposed on the first absorber layer 250. The second absorber layer 230 is disposed on the barrier layer 240. For a second Long Wave absorber, the second absorber layer 230 comprises multiple periods of InAs/InSb/GaSb where each period comprises 14 monolayers of InAs, 1 monolayer of InSb, and 7 monolayers of GaSb. Without implying a limitation, sufficient periods of InAs/InSb/GaSb are built up to form the second absorber layer 230 of approximately 2.5 microns thick. The second absorber layer 230 may be doped Fr type with compounds and to a density known to those of skill in the art.

The second contact layer 220 comprises multiple periods of InAs/InSb/GaSb where each period comprises 14 monolayers of InAs, 1 monolayer of InSb, and 7 monolayers of GaSb. Without implying a limitation, approximately 100 periods of InAs/InSb/GaSb are built up to form a contact layer approximately 0.5 micron thick. The second contact layer 220 may be doped $P^+$ type with compounds and to a density known to those of skill in the art.

The thicknesses above are exemplary only and may be adjusted as known by those skilled in the art. In particular, the first absorber layer 260 and second absorber layer 230 may be thicker to improve the quantum efficiency. In addition, the specific composition may be adjusted for the particular wavelength of light to be absorbed in a layer. The dopant used in the layers is preferably beryllium although other materials are known to those of skill in the art. Typical doing concentrations range between $1 \times 10^{15}$ to $1 \times 10^{16}$ cm$^{-3}$ for the barrier layer 240. Doping levels are less than $3 \times 10^{15}$ cm$^{-3}$ for the absorber layers 230 and 260. It may also be necessary to dope the material using an n-type dopant to compensate if the intrinsic carrier concentration of the barrier layer is p-type and higher in magnitude than desired.

Various other compositions of the absorber layers are possible. Without implying a limitation, the absorber layers 230 and 250 may comprise InAs/InGaSb, InAs/GaSb, InAs/InSb/GaSb/InSb.

Figure 2B:
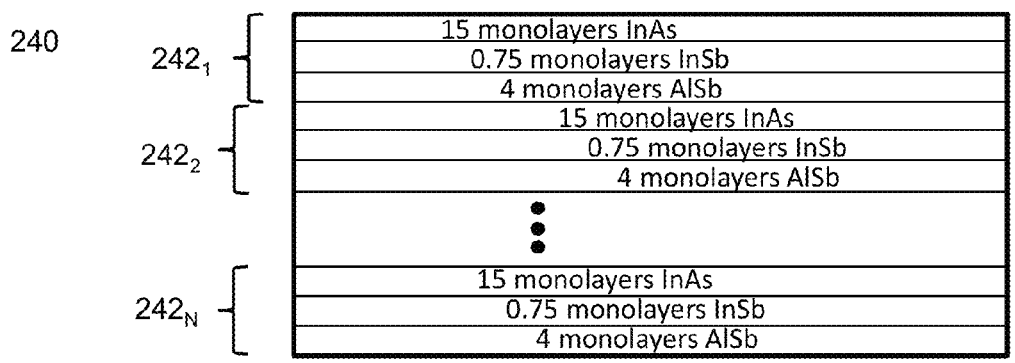
FIG. 2B shows the details of the barrier design used in the detector of FIG. 2A.

Continuing with an LWIR/LWIR embodiment, the barrier layer 240 in FIG. 2A is detailed in the barrier 240 design of FIG. 2B, which uses, without implying a limitation, multiple periods 242 of InAs/InSb/AlSb superlattice periods. A period 242 comprises, for example, 15 monolayers of InAs, an average 0.75 monolayers of InSb and 4 monolayers of AlSb. Sufficient numbers of these periods 242 are stacked to build up a barrier layer 240 to a thickness of approximately 2500 angstroms, as show in FIG. 2B.

In general, the InSb layer added to the contact layers 220 and 260, the absorber layers 230 and 250, and the barrier layer 240 is used to tune the lattice constant to achieve lattice matching to the GaSb substrate.

An alternative barrier design for the LWIR/LWIR embodiment comprises 0.325 monolayers of InSb, 4 monolayers of AlSb, 0.325 monolayers of InSb and 15 monolayers of InAs. The composition of the barrier layer 240 may also vary depending on the wavelength of light absorbed by each absorber layer 250 and 230.

The composition of superlattice periods of the absorber layers 230 and 250 and contact layers 220 and 260 were chosen based on the target cutoff wavelengths. Alternative cutoff wavelengths would require different superlattice compositions. The relative fractions of the InAs/InSb/AlSb barrier layer described are exemplary only and may be varied in order to maintain minimal conduction band offset.

For a MidWave InfraRed/Long Wave InfraRed (MWIR/LWIR) embodiment the first contact layer 270 comprises multiple periods of InAs/InSb/GaSb where each period comprises 9 monolayers of InAs, 0.6 monolayers of InSb, and 7 monolayers of GaSb. Without implying a limitation, approximately 200 periods of InAs/GaSb are built up to form a contact layer approximately 1.2 micron thick. The first contact layer 260 may be doped $P^+$ type with compounds and to a density known to those of skill in the art. A typical doping density is 5.0E17.

For a midwave absorber region (MWIR), the first absorber layer 250 comprises multiple periods of InAs/InSb/GaSb where each period comprises 9 monolayers of InAs, 0.6 monolayers of InSb, and 7 monolayers of GaSb. Without implying a limitation, sufficient periods of InAs/GaSb are built up to form the first absorber layer 250 approximately 4 microns thick. The first absorber layer 250 may be doped $P^-$ type with compounds and to a density known to those of skill in the art. Typical doping density is 1.0E16.

Continuing with FIG. 2A for a MWIR/LWIR detector, the barrier layer 240 is disposed on the first absorber layer 250. The barrier layer 240 uses, without implying a limitation, multiple periods 242 of InAs/InSb/AlSb superlattice periods. A period 242 comprises, for example, 15 monolayers of InAs, 0.75 mL InSb, and 4 monolayers of AlSb. Sufficient numbers of these periods 242 are stacked to build up a barrier layer 240 to a thickness of approximately 2500 angstroms.

The second absorber layer 230 is disposed on the barrier layer 240. For a Long Wave absorber, the second absorber layer 230 comprises multiple periods of InAs/InSb/GaSb where each period comprises 14 monolayers of InAs, 1 monolayer of InSb, and 7 monolayers of GaSb. Without implying a limitation, sufficient periods of InAs/GaSb are built up to form the second absorber layer 230 of approximately 2.5 microns thick. The second absorber layer 230 may be doped $P^-$ type with compounds and to a density known to those of skill in the art. Typical doping density is 1.0E16.

The second contact layer 220 comprises multiple periods of InAs/InSb/GaSb where each period comprises 14 monolayers of InAs, 1 monolayer of InSb, and 7 monolayers of GaSb. Without implying a limitation, approximately 100 periods of InAs/GaSb are built up to form a contact layer approximately 0.5 micron thick. The second contact layer 220 may be doped $P^+$ type with compounds and to a density known to those of skill in the art. Typical doping density is 5.0E17.

Various methods may be used to create the monolayer structures described above. Among them, and without implying a limitation is Molecular Beam Epitaxy (MBE) and sputtering. If MBE is used to build the layers the thickness may be controlled, at least in part, through the time used to grow a layer.

A Type II Superlattice Dual Band Photodetector generally has an offset between the conduction band of a first absorber region and the conduction band of an adjacent second absorber region. A principle of the present invention minimizes the effective offset with a Type II Superlattice barrier layer through selection of the number and composition of the monolayers of the barrier layer. Different absorber layers may be designed for different cutoff wavelengths. Given these cutoff wavelengths will set the bandgap of the absorber layers. Once the bandgaps of the first absorber layer and second absorber layer are set, a barrier layer may be designed according to the principles of the present invention to smooth the conduction band transition from the first absorber layer to the second The barrier layer may comprise multiple periods where each period comprises several monolayers.

Figure 4A:
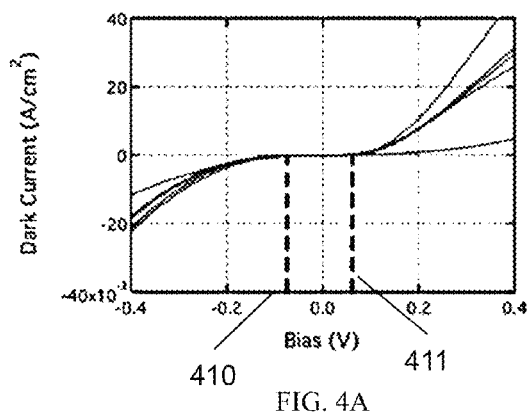
FIG. 4A plots the dark current for a LW/LW detector versus bias voltage.
Figure 4B:
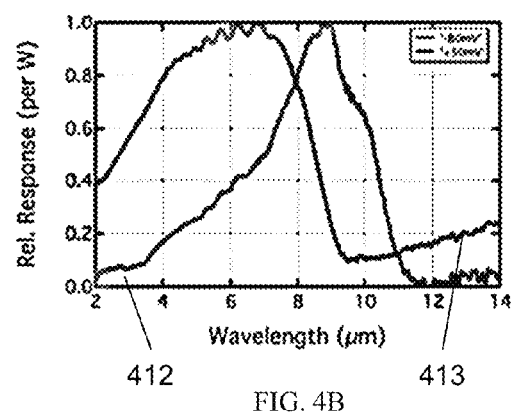
FIG. 4B plots the spectral response of an exemplary LW/LW T2SL detector.

Experimental data for a sequential-mode LWIR1/LWIR2 dual-band T2SL detector according to the principles of the present invention is shown in FIG. 4A and FIG. 4B. Discrete diodes were fabricated by wet etching using a citric-based chemistry. A deep etch was used to make the bottom contact, while the mesa isolation etch went approximately one micron below the barrier region. The I-V characteristics and dual-band spectral response are shown in FIGS. 4A and 4B respectively. The 80K spectral response was acquired using an FTIR while the sample was mounted in a low temperature dewar setup for backside illumination through the GaSb substrate. The LWIR1 band 413 has a cutoff around 8.5 μm, while the LWIR2 band 412 is around 10.5 μm. The dark current at 78K for the LWIR2 band 410 ($\lambda_{CO}$=10.5 μm) is $1.8 \times 10^{-4}$ A/cm$^2$, and the T2SL barrier design enables low bias less than ±80 mV turn-on for each band. The performance of the LWIR1 band 411 detector is similar. FIG. 4b shows the response per watt. Each detector is operated alternatively. Curve 412 shows the response when the LWIR2 detector is biased −80 mv while 413 shows the response when the LWIR1 detector is biased +50 mV.

A method 100 to fabricate a detector 200 according to the principles of the present invention is illustrated in FIG. 1. Initially a substrate 280, which may be GaSb is received in step 110. An etch stop layer 270 may be added in step 120 to the substrate 280 to facilitate subsequent removal of the substrate 280 from the detector 200. The first contact layer 260 is deposited in step 130 as multiple periods of InAs/InSb/GaSb, 11 monolayers of InAs, 0.8 monolayers of InSb, and 5 monolayers of GaSb per period to form required thickness of approximately 1.2 micron, doped P+. In step 140 a first absorber layer 250 is deposited as multiple periods of InAs/InSb/GaSb, 11 monolayers of InAs, 0.8 monolayers InSb, and 5 monolayers GaSb per period to form the required thickness of approximately 4 microns, doped P−. In step 150 the barrier layer 240 is deposited as multiple periods of InAs/InSb/AlSb, 15 monolayers of InAs, 0.7 monolayers InSb and 4 monolayers of AlSb per period to form the required thickness of approximately 2500 angstroms, doped P−. In step 160 a second absorber layer 230 is deposited as as multiple periods of InAs/InSb/GaSb, 14 monolayers of InAs, 1 monolayer of InSb, and 7 monolayers GaSb per period to form the required thickness of approximately 2 microns, doped P−. In step 170 a second contact layer 220 is deposited as multiple periods of InAs/InSb/GaSb, 14 monolayers of InAs, 1 monolayer of InSb, and 7 monolayers GaSb per period to form the required thickness of approximately 0.5 microns, doped P+. In step 180 a cap layer 210 is deposited as 100 Angstroms of GaSb doped P+. Finally, in step 190 the substrate 280 may be removed and the detector 200 may be integrated with a Read Out Integrated Circuit.

A detector structure will function whether or not the substrate is removed. However, GaSb substrates absorb infrared radiation, thus removal is desirable so that as much IR light can be absorbed as possible when making focal planes. Alternative methods are to thin the GaSb down to typically <100 microns, where absorption in the substrate is somewhat minimized. When significant GaSb substrate remains, the ROIC will probably needed to be shimmed to accommodate the differences in the thermal mismatch between the Silicon readout and the GaSb substrate.

However constructed, the shorter wavelength (wider bandgap) absorber layer should receive the incident light before this light passes to the longer wavelength absorber layer.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . ."

What is claimed is:

1. A dual band photodetector comprising:
a Type II Superlattice (T2SL) barrier layer with an upper surface and a lower surface, the T2SL barrier layer comprising a plurality of monolayers doped P type with a dopant;
a first absorber layer doped P type disposed on the upper surface of the T2SL barrier layer;
a second absorber layer doped P type disposed on the lower surface of the T2SL barrier layer.

2. The dual band photodetector of claim 1 wherein the plurality of monolayers comprise repeating sets of layers of a first type, a second type and third type.

3. The dual band photodetector of claim 1 wherein the P type doping of the T2SL is between 1.0E15 and 1.0E16 per $cm^3$.

4. The dual band photodetector of claim 2 wherein the first type of monolayer comprises AlSb, the second type of monolayer comprises InSb and the third type of monolayer comprises InAs.

5. The dual band photodetector of claim 2 wherein a number of monolayers of a first type is 4, a number of monolayers of a second type is 0.75 and a number of layers of a third type is 15.

6. The dual band photodetector of claim 2 wherein a number of sets of repeating layers comprise an overall thickness of 2500 angstroms.

7. The dual band photodetector of claim 1 wherein the plurality of monolayers comprise repeating sets of layers of a first type, a second type third type and a fourth type.

8. The dual band photodetector of claim 7 wherein the first type of monolayer comprises InSb, the second type of monolayer comprises AlSb, the third type of monolayer comprises InSb and the fourth type of monolayer comprises InAs.

9. The dual band photodetector of claim 8 wherein a number of monolayers of a first type is 0.325, a number of monolayers of a second type is 4, a number of layers of a third type is 0.325 and a number of monolayers of a fourth type is 15.

10. The dual band photodetector of claim 8 wherein a number of sets of repeating layers comprise an overall thickness of 2500 angstroms.

11. The dual band photodetector of claim 1 wherein the plurality of monolayers comprise repeating sets of layers of a first type, a second type.

12. The dual band photodetector of claim 11 wherein the P type doping of the T2SL is between 1.0E15 and 1.0E16 per $cm^3$.

13. The dual band photodetector of claim 11 wherein the first type of monolayer comprises AlSb, the second type of monolayer comprises InAs.

14. A Type II Superlattice Dual Band Photodetector comprising:
a first absorber layer adapted to absorb light with a wavelength between 3 microns and 14 microns;
a second absorber layer adapted to absorb light with a wavelength between 3 microns and 14 microns; and
a barrier layer means disposed between the first absorber layer and the second absorber layer for eliminating a depletion region between the first absorber layer and the second absorber layer for the dual band Photodetector.

15. A dual band photodetector comprising:
a Type II Superlattice (T2SL) barrier layer with an upper surface and a lower surface, the T2SL barrier layer comprising a plurality of monolayers doped P type with a dopant;
a first absorber layer disposed on the upper surface of the T2SL barrier layer adapted to respond to a bias voltage of a first polarity;
a second absorber layer disposed on the lower surface of the T2SL barrier layer adapted to respond to a second bias voltage of an opposite polarity to that of the first polarity.

* * * * *